United States Patent [19]
Perlberg et al.

[11] Patent Number: 5,421,503
[45] Date of Patent: Jun. 6, 1995

[54] FINE PITCH CAPILLARY BONDING TOOL

[75] Inventors: Gil Perlberg, Elkins Park; Jon W. Brunner, Sellersville, both of Pa.

[73] Assignee: Kulicke and Soffa Investments, Inc., Wilmington, Del.

[21] Appl. No.: 294,923

[22] Filed: Aug. 24, 1994

[51] Int. Cl.⁶ ............................................. H01L 21/603
[52] U.S. Cl. .................................... 228/4.5; 228/180.5
[58] Field of Search ................ 228/4.5, 1.1, 110.1, 228/180.5; 219/56.21

[56] References Cited

U.S. PATENT DOCUMENTS

| | | |
|---|---|---|
| 4,911,350 | 3/1990 | Araki et al. .......................... 228/1.1 |
| 4,974,767 | 12/1990 | Alfaro et al. ....................... 228/44.7 |
| 5,111,989 | 5/1992 | Holdgrafer et al. ............. 228/180.5 |

*Primary Examiner*—Samuel M. Heinrich
*Attorney, Agent, or Firm*—John B. Sowell

[57] ABSTRACT

An improved fine pitch bonding tool for use in automatic gold ball bonders for bonding fine gold wires onto closely spaced pads on semiconductors comprises a cylindrical body portion which fits into an ultrasonic transducer and is provided with a bottle-neck working tip on the other end of the body portion for bonding fine gold wires. The working tip is provided with a wire hole diameter less than 1.4 times the diameter of the fine wire to be bonded and is further provided with a chamfer diameter on the working tip which is less than 2.5 mils across. The total tip diameter on the working tip is less than 6 mils and the working face which comprises an annular ring between the chamfer diameter and the tip diameter is provided with a face angle of approximately 22 degrees plus or minus 3 degrees. Even though the bonding tool has a smaller area working face, it has been found to produce second bonds whose pull strength is equal to prior art capillary bonding tools having larger tip diameters and working faces.

11 Claims, 3 Drawing Sheets

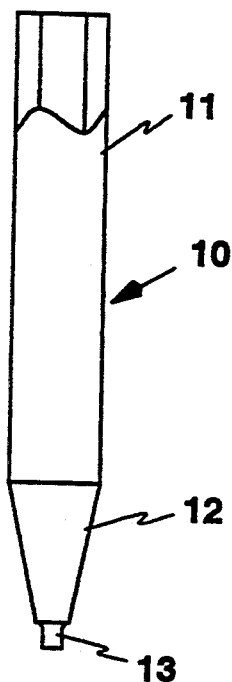
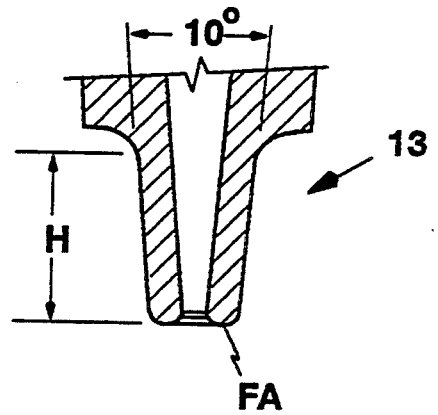
Figure 1
Prior Art
Figure 2
Prior Art
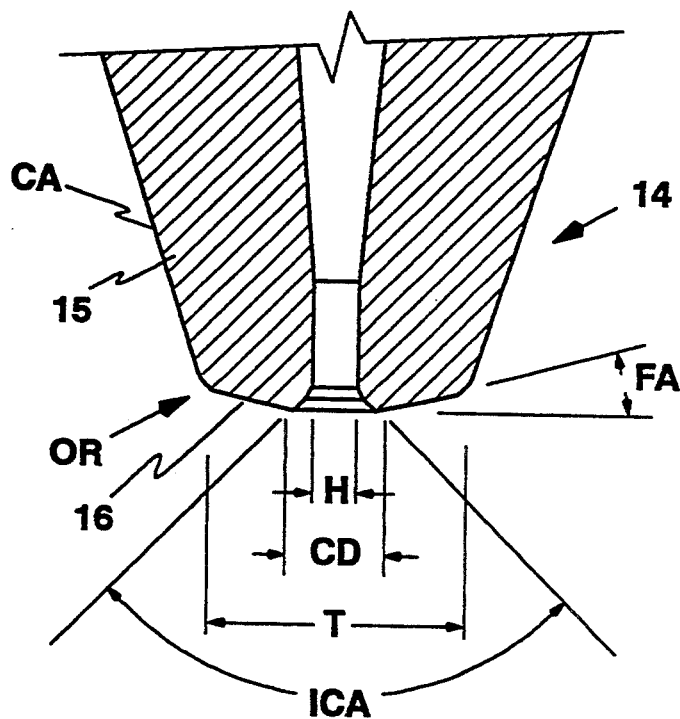
Figure 3
Prior Art

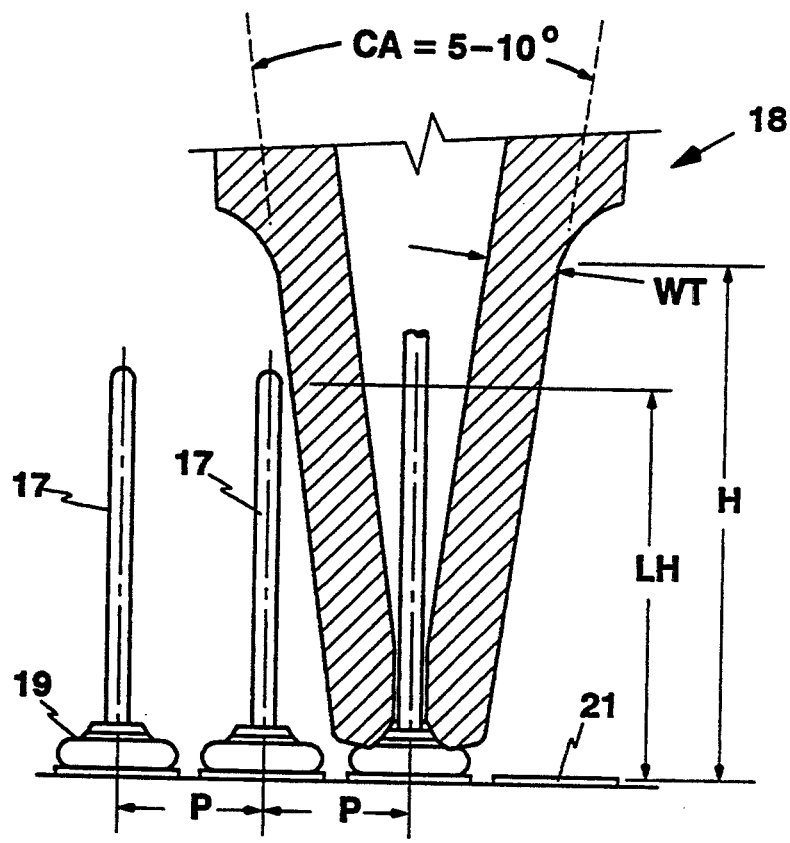
*Figure 4*
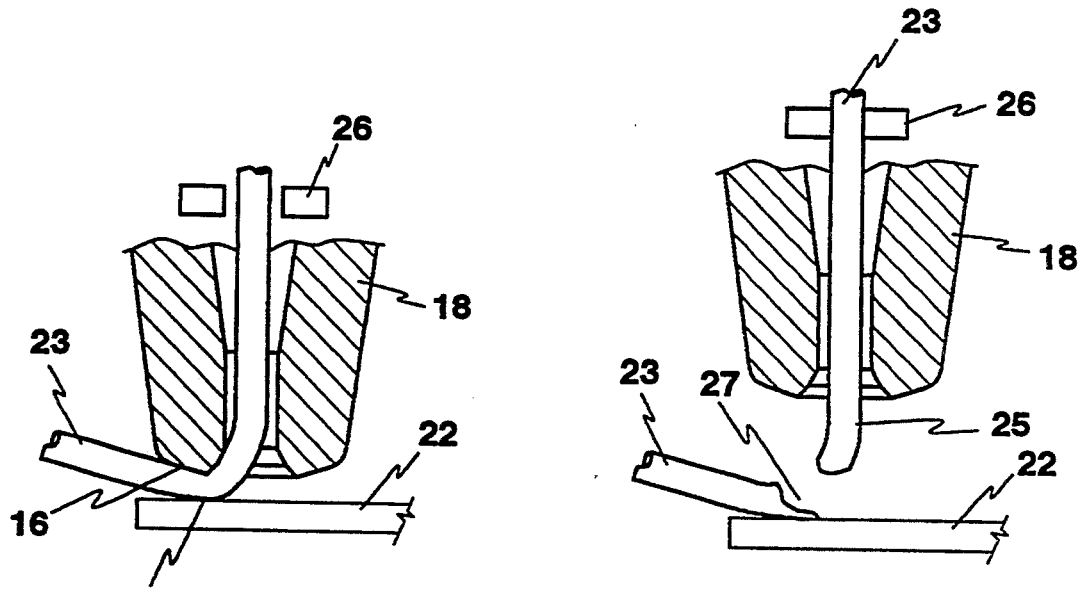
*Figure 5*   *Figure 6*

FINE PITCH CAPILLARY BONDING TOOL

BACKGROUND OF THE INVENTION

1. Field of the Invention

The present invention relates to high-speed bonding capillaries of the type used in automatic wire bonders to make fine wire interconnections between the pads on a semiconductor chip and the leads on a lead frame or carrier.

2. Description of the Prior Art

Capillary wire bonding tools are known in the prior art and are classified in International Class B23K 3/00 and in U.S. Class 219, Subclasses 85D and 85F.

Capillary wire bonding tools that are used in automatic wire bonders have become substantially standardized into families or groups that have their own special applications. In order to define the problems solved by the present invention, it will be sufficient to refer to only two of these groups, namely standard high-speed capillary bonding tools and standard close center bonding tools.

Standard high-speed bonding capillaries were developed for use on automatic ball thermosonic wire bonders that produce consistent fine wire interconnections over long time periods without interruption or without requiring maintenance between work shifts.

In recent years the semiconductor chips that require a wire bonding step or operation have become much smaller or miniaturized to effect increases in speed as well as to effect high density of the active elements on the chip. The present state of the art high density chip may require about 50 lead out pads on each of the four sides of the rectangular chip. The pads on such high production chips may typically be 3.5 mils square placed on 4.5 mils centers leaving a pad gap of approximately 1.0 mils.

If the 3.5 mils square pads are ball bonded using 1.0 mil fine gold wire and if the aforementioned high-speed bonding capillaries are used, three problems occur. First, the diameter of the capillary is so great that when making a first ball bond that the sides of the capillary touch the previously bonded interconnected wires and secondly the tip of the bonding tool contact or nicks the mashed or squashed balls of the adjacent bonded wire. The recommended free air ball size for 1.0 mil diameter wire is about 2.4 mils. When bonded the mashed or squashed bonded ball at first bonds are capable of a minimum of 2.9 mils but nominally about 3.5 times the diameter of the fine wire. Not only would the nominal bonded ball equal the size of the 3.5 mil square bond pad, but there would be no allowance or tolerance for misplacing of the ball from the exact center of the pad.

Close center capillary bonding tools, sometimes referred to as close pitch or bottle neck tip capillary tools were developed to permit bonding on a fine pitch chip. The tip and neck of the capillary was reduced which resulted in a smaller working face on the tip of the bonding tool. The reduced neck avoids interference with the adjacent bonded wires, however, the reduced working face of the prior art type bottle neck tip capillary bonding tool also results in reduction of the pull strength of the second bond and shear strength of the second bond. However, it was possible to bond 1.0 mil wire on 2.9 mil pads spaced on 3.8 mil centers with reduced strength bonds.

There is presently an urgent need to provide automatic thermosonic gold wire bonders with a production capability for bonding under 3.0 mil pads on under 3.8 mil pitch centers without compromising the pull strength or the shear strength of the first and second bonds. It would be highly desirable to provide a novel fine pitch bonding capillary which would permit making repeatable strong fine wire interconnections on small size pads placed on very close pitch centers than was heretofore possible under production conditions in the prior art.

SUMMARY OF THE INVENTION

It is a principal object of the present invention to provide an improved bottle-neck tip shaped fine pitch capillary bonding tool.

It is a principal object of the present invention to provide an improved working face for a fine pitch capillary bonding tool.

It is another principal object of the present invention to provide a fine pitch capillary bonding tool that has a smaller tip diameter and a smaller working face yet produces second bonds of strength equal to bonding tools having larger working faces.

It is another object of the present invention to provide a fine pitch capillary bonding tool having a small tip diameter and a small working face that has high structural strength and long life.

According to these and other objects of the present invention there is provided an improved bottle neck fine pitch capillary bonding tool for bonding small air balls on pads smaller than 3.0 mils. The working face including the cone diameter and the tip diameter is decreased while maintaining the shear strength and pull strength of the bonds by increasing the face angle of the tip of the bonding tool and decreasing the hole diameter in the tip of the bonding tool.

BRIEF DESCRIPTION OF THE DRAWINGS

FIG. 1 is a side elevation of a prior art bottle-neck capillary bonding tool;

FIG. 2 is an enlarged section in elevation of the tip of the bottle-neck capillary bonding tool shown in FIG. 1;

FIG. 3 is an enlarged section in elevation of the tip of a prior art high-speed capillary bonding tool;

FIG. 4 is an enlarged section in elevation of the present invention capillary bonding tool showing the front of a fine pitch bonded wire at first bond;

FIG. 5 is an enlarged elevation of the tip of the present invention capillary bonding tool showing the tip of the bonding tool during the formation of a second bond;

FIG. 6 is an enlarged section in elevation of the tip of the present invention capillary bonding tool showing the tail of the fine wire being broken from the second bond;

DETAILED DESCRIPTION OF THE PREFERRED EMBODIMENTS

Figure 7:
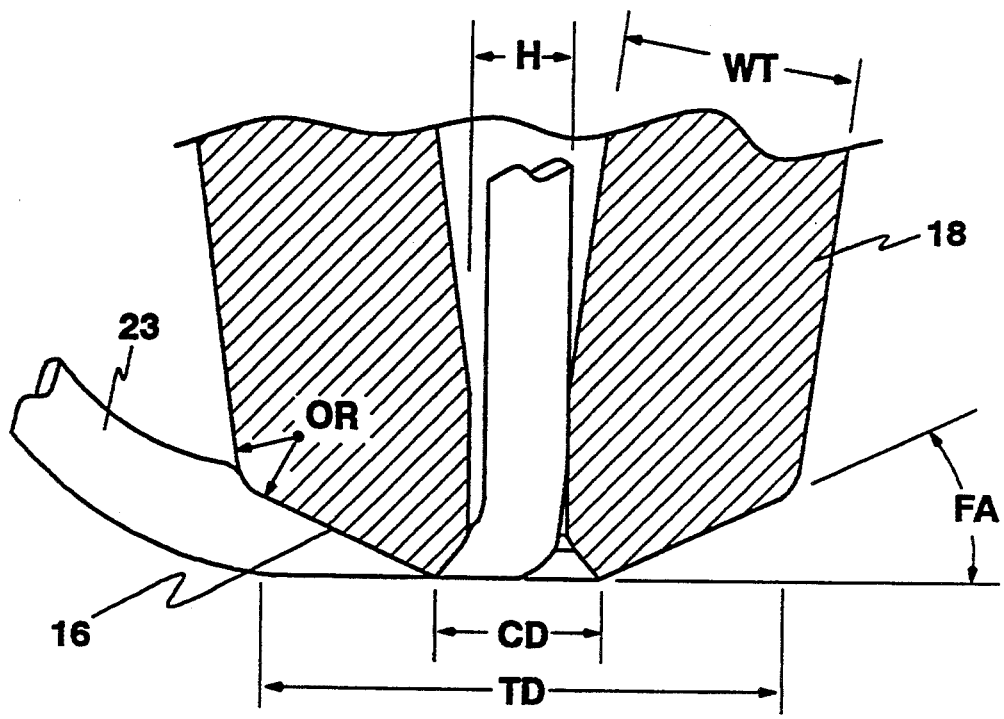
FIG. 7 is a greatly enlarged section in elevation of the tip of the preferred embodiment of the present invention capillary bonding tool at second bond.

Refer now to FIG. 1 showing a side elevation of a prior art bottle-neck capillary bonding tool 10 of the type having a cylindrical body portion 11, an outer cone angle 12 and a bottle-neck 13 which comprises a tip.

Refer now to FIG. 2 showing an enlarged section in elevation of the bottle-neck or tip 13 of the capillary bonding tool shown in FIG. 1. The bottle neck cone angle is shown having approximately 10 degree taper which was standard for such prior art tools. Further, such prior art bottle-neck bonding tools were made having a face angle (FA) of zero to 8 degrees. Such prior art bottle-neck bonding tools were usually provided with a neck height (H) of approximately 18 mils.

Refer now to FIG. 3 showing an enlarged section in elevation of a prior art high-speed capillary bonding tool 14. The cone angle (CA) 15 of the high-speed bonding tool 14 is nominally 30 degrees and tapers from the body down to the working face 16 where it is connected by an outer radius of approximately 1.0 mils. The face angle (FA) is nominally 4 degrees but may be zero to 8 degrees. The inner chamfer angle (ICA) is nominally 90 degrees or 120 degrees. The chamfer diameter (CD) is 2.5 mils and the tip diameter (T) is 7.0 mils. Thus, the working face 16 comprises a relatively large tapered annular ring. The hole diameter (H) for the fine wire is 1.5 mils which will accommodate and bond a minimum size air ball of 2.4 mils using a 1.0 mil wire. The bore diameter or hole diameter is normally 0.5 mils larger than the wire diameter. It was known in the prior art that special tools could be ordered by making minor changes to the nominal dimensions described hereinbefore with reference to the high-speed bonding capillary shown in FIG. 3. However, the changes were usually very small so as not to change the process of bonding for which the tool was empirically designed.

Refer now to FIG. 4 showing an enlarged section in elevation of the tip of the present invention capillary bonding tool having a front view of bonded wires 17 at a first bond. The present invention bonding tool 18 is preferably provided with a cone angle from 5 to 10 degrees and having a minimum wall thickness (WT) of 2.0 mils. The bottle-neck height (H) is preferably made 6 to 10 mils for producing low loop interconnecting fine wires. The loop height (LH) of the bonded wire 17 is preferably 4 to 7 mils in height as will be explained in detail hereinafter. The mashed or squashed balls 19 may be maintained at a diameter of 2.1 mils so that the bonding tool 18 is capable of bonding 1 mil fine wires on pads 21 of 2.5 mils while maintaining a minimum pitch (P) of 2.76 mils.

Refer now to FIG. 5 showing an enlarged section and elevation of the tip of the present invention capillary bonding tool showing the formation of a second bond on a carrier or lead frame 22. The face 16 of the bonding tool 18 is creating what is known as the second or wedge bond by mashing completely through the fine wire 23 while having ultrasonic energy from a transducer imparted to the bonding tool. The bonding operation at second bond creates the thin separation point 24 where the tail of the wire separates from the second bond. To make a tail 25, the bonding tool 18 is raised while the wire clamps 26 remain open so that a tail is paid out below the bonding tool before closing the wire clamps 26. As shown in FIG. 6, after the wire clamps 26 are closed, the bonding tool 18 and the wire clamps 26 are raised so that the fine wire 23 breaks leaving a tail 25 and the connecting fine wire 23 is provided with a second wedge bond 27 on lead frame 22.

Refer now to FIG. 7 showing a greatly enlarged section in elevation of the tip of the preferred embodiment capillary bonding tool 18. In the preferred embodiment tool 18, the tip diameter (TD) is only 4 mils, the chamfer diameter (CD) is 1.8 mils and the hole or bore size is 1.2 mils for a 1 mil fine wire 23. The face angle (FA) of the preferred embodiment tool 18 is made at 20 degrees and is operable at minus 2 to plus 5 degrees. The outer radius is made very small and for a 1 mil wire capillary is 0.3 mils. Even though the tip diameter and the working face 16 have been decreased in area, the second bond strength and consistent reliability is the same as the prior art high-speed bonding tools which have a much larger working face 16 and normally create a larger wedge bonded area.

It would not be apparent that a person could decrease the tip diameter in order to increase the fine pitch capability of the bonding tool and still make strong bonds. However, after changing the critical dimensions of the bonding tool that effect bonding strength, the face angle is increased and the chamfer diameter as well as the outer radius is decreased so as to provide a working face or wedge which creates highly reliable and repeatable second bonds equal in pull strength to prior art bonds.

Figure 8:
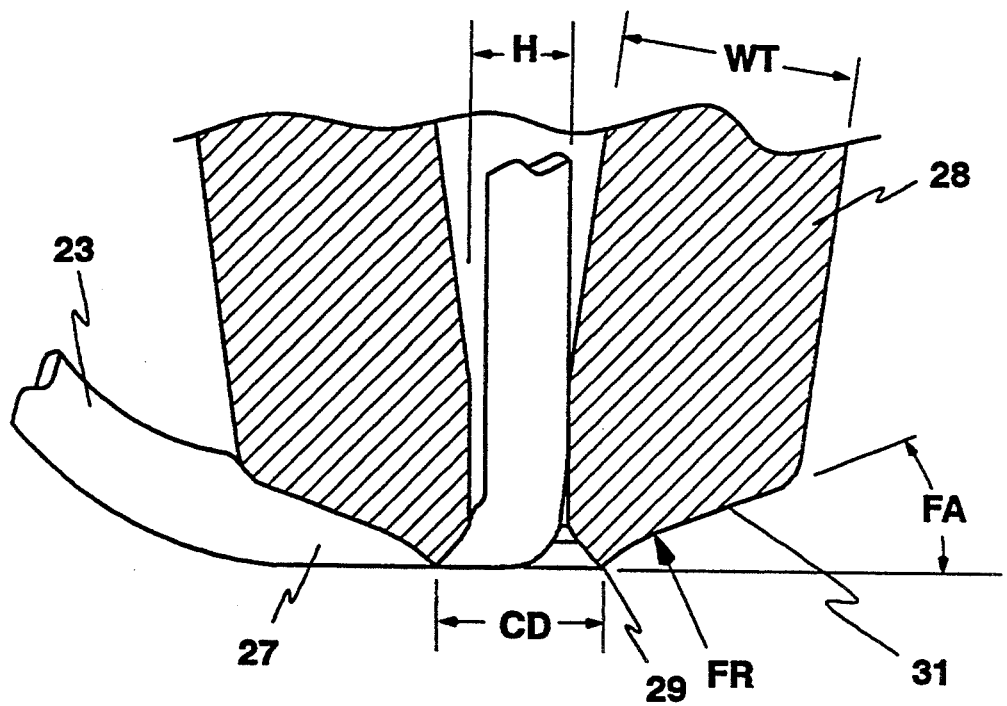
FIG. 8 is a greatly enlarged section in elevation of the tip of a modified embodiment of the present invention capillary bonding tool at second bond.

Refer now to FIG. 8 showing a greatly enlarged section in elevation of a tip of a modified preferred embodiment bonding tool 28. The dimensions and angles of the bonding tool 18 shown in FIG. 7 are identical to those in the bonding tool 28 of FIG. 8 with the exception of the working face 16 which is provided with a face radius (FR) of 5.0 mils plus or minus 1.0 mils. The face radius shown connects between a point 29 at the chamfer diameter and a point 31 which becomes tangent to the face angle (FA). It has been found that the curved face radius increases the bond strength by increasing the thickness of the second bond 27 of the fine wire 23. This is accomplished without any increase in the area in the bond 27 on the lead 22.

Having explained a preferred embodiment and a modification of the preferred embodiment of the present invention, it will be now be appreciated that the new fine pitch bonding tools 18 and 28 meet the new standard for bonding on fine pitch. In order to appreciate and understand the difference between the prior art tools and the present invention fine pitch tool, a Table 1 is presented as follows:

TABLE 1

| Features in Mils or Deg. | Fine Pitch Tool | Close Pitch Tool | Standard H.S. Tool |
|---|---|---|---|
| Wire Dia. | 1.0 | 1.0 | 1.0 |
| Cone Angle | 10.0° | 10.0° | 30.0° |
| Tip Dia. | 4.0 | 6.0 | 7.0 |
| Face Angle | 20.0° | 4.0° | 4.0° |
| Outer Radius | 0.3 | 1.0 | 1.0 |
| Chamfer Dia. | 1.8 | 2.5 | 2.5 |
| Chamfer Ang. | 90° | 90° | 90° |
| Bore Dia. | 1.2 | 1.5 | 1.5 |
| Min Air Ball | 1.6 | 2.0 | 2.4 |
| Mashed Ball | 2.1 | 2.4 | 2.9 |
| Wire Height | 6.0 | 6.0 | 6.0 |
| Min. Pad | 2.5 | 2.9 | 3.4 |
| Min. Pitch | 2.76 | 3.76 | 4.5 |

The above table was prepared for comparison purposes employing 1.0 mil wire and using the finest or theoretical pitch and bonding size which was compatible with the prior art and present invention tools. Thus, the information in Table 1 above may be summarized as the bonding dimensions for zero sigma production in which no allowance is made for the machine inaccuracies and process variations which may vary between bonding machines.

Having explained Table 1 above, it will be appreciated that the novel fine pitch bonding tool shown in FIGS. 7 and 8 may be scaled to bond even smaller or larger diameter wires. For example, when bonding a 0.7 mil fine gold wire, the hole diameter will decrease to approximately 0.9 mils while the other relative dimensions remain approximately the same so that a small air ball may be bonded onto pads less than 2.8 mils across. Similarly, when bonding 1.3 mil fine gold wires, the hole diameter is increased to approximately 1.5 mils and the novel bonding tool is capable of bonding pads on less than 3.3 mils across.

Even though the working face area is reduced for each of the fine pitch bonding tools described above, it is possible to increase the face angle and decrease the size of the inner chamfer angle recess so that first and second bonds are fully as strong in tension as the fine wire being used within the limits defined.

Heretofore, bonding wedges were made from tungsten on titanium carbide and bonding capillaries were preferably made from high density proprietary sintered ceramic such as aluminum oxide ($Al_2O_3$). Thus, the limits for fineness of close pitch tools are affected by wall thickness (WT) of the materials used to make the capillaries as well as the bonding strength of the bonded wires. As higher strength materials become available, it may be possible to reduce wall thickness of the bonding tools. This would not affect the minimum area of working face required to make strong bonds, but could affect reliability and longevity of the tools. Further, there is presently a limit to the reduction of wire size which is near 1.0 mils in diameter if problems of wire movement during packaging are to be avoided.

What is claimed is:

1. A fine pitch bonding tool for use in automatic gold ball bonders to interconnection fine wires between very small closely spaced bonding pads on semiconductor chips and leads on a carrier, said tool comprising:
    a cylindrical body portion having a wire guide aperture through the center of the body portion,
    a bottle-neck working tip on one end of said body portion,
    a wire hole diameter in said working tip less than 1.4 times the diameter of the fine wire to be bonded,
    a chamfer diameter on said working tip less than 2.5 mils,
    a tip diameter on the working tip less than 6.0 mils, and
    a working face on said working tip formed as an annular ring between said chamfer diameter and said tip diameter having a face angle in excess of 15 degrees so that first and second bonds made with said fine wires have a tensile pull strength that is equal to capillary bonding tools having larger chamfer diameters and larger working faces.

2. A fine pitch bonding tool as set forth in claim 1 which further includes an outer radius between the cone diameter and the face angle of less than 0.5 mils.

3. A fine pitch bonding tool as set forth in claim 1 which comprises a fine wire hole diameter approximately 1.2 mils in diameter for bonding 1.0 mil fine gold wires.

4. A fine pitch bonding tool as set forth in claim 3 wherein said chamfer diameter defines a recess approximately 1.8 mils in diameter for bonding air balls made on said fine wire approximately 1.6 mils in diameter.

5. A fine pitch bonding tool as set forth in claim 4 where in said chamfer diameter recess extrudes and contains said air ball during a bonding operation to create a mashed ball which may be contained on pads less than 2.9 mils across.

6. A fine pitch bonding tool as set forth in claim 1 which comprises a fine wire hole diameter approximately 0.9 mils in diameter for bonding 0.7 mils fine gold wires on to pads less than 2.8 mils across.

7. A fine pitch bonding tool as set forth in claim 1 which comprises the fine wire hole diameter approximately 1.5 mils in diameter for bonding 1.3 mil fine gold wires on to pads less than 3.3 mils across.

8. A fine pitch bonding tool as set forth in claim 1 wherein said bottle-neck working tip comprises a cone angle less than 10 degrees.

9. A fine pitch bonding tool as set forth in claim 7 wherein the wall thickness of said working tip is larger than 2.0 mils in thickness.

10. A fine pitch bonding tool as set forth in claim 1 wherein said face angle on said working tip is approximately 20 degrees.

11. A fine pitch bonding tool as set forth in claim 1 wherein said face angle on said working tip is formed as a curve having a face radius of 6.0 mils.

* * * * *